(12) United States Patent
Miki Yoshida et al.

(10) Patent No.: US 11,479,502 B2
(45) Date of Patent: Oct. 25, 2022

(54) COATING HAVING SOLAR CONTROL PROPERTIES FOR A SUBSTRATE, AND METHOD AND SYSTEM FOR DEPOSITING SAID COATING ON THE SUBSTRATE

(71) Applicant: Vitro Vidrio y Cristal, S.A. de C.V., Garcia (MX)

(72) Inventors: Mario Miki Yoshida, Chihuahua (MX); Patricia Amezaga Madrid, Chihuahua (MX); Pedro Piza Ruiz, Chihuahua (MX); Wilber Antunez Florez, Chihuahua (MX); Oscar Vega Becerra, Apodaca (MX); Sandra Viridiana Flores Arevalo, Monterrey (MX); Rosa Elena Ramirez Garcia, San Nicolas de los Garza (MX); Zoulfia Nagamedianova, San Pedro Garza Garcia (MX); Miguel Arroyo Ortega, Guadalupe (MX)

(73) Assignee: Vitro Vidrio y Cristal, S.A. de C.V., Garcia (MX)

( * ) Notice: Subject to any disclaimer, the term of this patent is extended or adjusted under 35 U.S.C. 154(b) by 131 days.

(21) Appl. No.: 16/802,743

(22) Filed: Feb. 27, 2020

(65) Prior Publication Data

US 2020/0199016 A1 Jun. 25, 2020

Related U.S. Application Data

(62) Division of application No. 14/435,252, filed as application No. PCT/MX2013/000127 on Oct. 11, 2013, now Pat. No. 10,597,324.

(30) Foreign Application Priority Data

Oct. 12, 2012 (MX) .................. MX/A/2012/011948

(51) Int. Cl.
*C23C 16/00* (2006.01)
*C03C 17/36* (2006.01)
(Continued)

(52) U.S. Cl.
CPC ............ *C03C 17/366* (2013.01); *C03C 17/36* (2013.01); *C03C 17/3642* (2013.01);
(Continued)

(58) Field of Classification Search
CPC .............. C03C 17/366; C03C 17/3642; C03C 17/3681; C03C 2217/42;
(Continued)

(56) References Cited

U.S. PATENT DOCUMENTS 3,660,137 A 5/1972 Furuuchi et al.
5,242,560 A 9/1993 Lingle et al.
(Continued)

FOREIGN PATENT DOCUMENTS

EP 2579074 A1 4/2013
GB 1241889 8/1971
(Continued)

OTHER PUBLICATIONS

Walters et al., Aerosol assisted chemical vapour deposition of ZnO films on glass with noblemetal and p-type dopants; use of dopants to influence preferred orientation, Feb. 16, 2009, Applied Surface Science 255 (2009) 6555-6560. (Year: 2009).*
(Continued)

*Primary Examiner* — Hai Y Zhang
(74) *Attorney, Agent, or Firm* — The Webb Law Firm

(57) ABSTRACT

The present invention relates to coating glass for architectural or automotive use, either monolithic or laminated, having solar control properties. The coating consists of several layers of different metal oxide semiconductors (TiO$_2$, ZnO, ZrO$_2$, SnO$_2$, AlO$_x$) and a layer of metallic
(Continued)

nanoparticles, which when superimposed on a pre-established order give the glass solar control properties. In particular the use of protective layers of n-type semiconductors around the metallic nanoparticles layer. It also relates to the method for obtaining the coating by means of the aerosol-assisted chemical vapor deposition technique, using precursor solutions containing an organic or inorganic salt (acetates, acetylacetonates, halides, nitrates) of the applicable elements and an appropriate solvent (water, alcohol, acetone, acetylacetone, etc.). The synthesis is performed at a temperature between 100 and 600° C. depending on the material to be deposited. A nebulizer converts the precursor solution into an aerosol which is submitted with a gas to the substrate surface, where due to the temperature the thermal decomposition of the precursor occurs and the deposition of each layer of the coating occurs.

15 Claims, 5 Drawing Sheets

(51) Int. Cl.
*C23C 16/448* (2006.01)
*C23C 16/40* (2006.01)

(52) U.S. Cl.
CPC ...... *C03C 17/3644* (2013.01); *C03C 17/3649* (2013.01); *C03C 17/3681* (2013.01); *C23C 16/403* (2013.01); *C23C 16/405* (2013.01); *C23C 16/407* (2013.01); *C23C 16/4486* (2013.01); *C03C 2217/42* (2013.01); *C03C 2217/70* (2013.01); *C03C 2218/1525* (2013.01)

(58) Field of Classification Search
CPC .......... C03C 2218/1525; C23C 16/403; C23C 16/405; C23C 16/407; C23C 16/4486
See application file for complete search history.

(56) References Cited

U.S. PATENT DOCUMENTS

| | | | |
|---|---|---|---|
| 6,190,457 | B1 | 2/2001 | Arai et al. |
| 7,011,711 | B2 | 3/2006 | Shreter et al. |
| 7,714,341 | B2 | 5/2010 | Chil Keun et al. |
| 2009/0186213 | A1 | 7/2009 | Ihlo et al. |
| 2011/0236715 | A1 | 9/2011 | Polcyn et al. |
| 2013/0071651 | A1 | 3/2013 | Hakuta et al. |
| 2013/0122281 | A1 | 5/2013 | Hakuta et al. |
| 2015/0155410 | A1 | 6/2015 | Lin et al. |

FOREIGN PATENT DOCUMENTS

| | | |
|---|---|---|
| WO | 2007042688 A1 | 4/2007 |
| WO | 2007051994 A2 | 5/2007 |
| WO | 2008071770 A1 | 6/2008 |
| WO | 2011123402 A1 | 10/2011 |

OTHER PUBLICATIONS

Lansåker et al.,TiO2/Au/TiO2 multilayer thin films: Novel metal-based transparent conductors for electrochromic devices, Thin Solid Films 518 (2009) 1225-1229. (Year: 2009).*

Palgrave et al., Aerosol Assisted Chemical Vapor Deposition Using Nanoparticle Precursors: A Route to Nanocomposite Thin Films, J. Am. Chem. Soc. 2006, 128, 1587-1597 9 1587. (Year: 2006).*

Amézaga-Madrid et al., Synthesis, structural characterization and optical properties of multilayered Yttria-stabilized ZrO2 thin films obtained by aerosol assisted chemical vapour deposition, Thin Solid Films 516 (2008) 8282-8288. (Year: 2008).*

Walters et al. Aerosol assisted chemical vapour deposition of ZnO films on glass with noble metal and p-type dopants; use of dopants to influence preferred orientation, Applied Surface Science 255 (2009) 6555-6560. (Year: 2009).*

Amezaga-Madrid et al., "Synthesis, structural characterization and optical properties of multilayered yttria-stabilized ZrO2 thin films obtained by aerosol assisted chemical vapour deposition", Thin Solid Films, 2008, pp. 8282-8288, vol. 516:23.

Hepp et al., "Aerosol-Assisted Chemical Vapor Deposited Thin Films for Space Photovoltaics", National Aeronautics and Space Administration, 2006, pp. 1-24, Glenn Research Center, Cleveland, Ohio.

Jeong et al., "Effect of Ag interlayer on the optical and passivation properties of flexible and transparent Al2O3/Ag/Al2O3 multilayer", Appl. Phys. Lett., 2008, vol. 93.

Lansaker et al., "TiO2/Au/TiO2 multilayer thin films: novel metal-based transparent conductors for electrochromic devices", Thin Solid Films, 2009, pp. 1225-1229, vol. 518:4.

Lin et al., "Improved crystallinity and optical properties of AlOx thin films by a ZnO interlayer", Materials Research Society, 2003, pp. 965-972, vol. 18:4.

Nagamedianova et al., "Solar heat reflective glass by nanostructured sol-gel multilayer coatings", Optical Materials, 2011, pp. 1999-2005, vol. 33.

Palgrave et al., "Aerosol assisted chemical vapor deposition using nanoparticle precursors: A route to nanocomposite thin films", J. Am. Chem. Soc., 2006, pp. 1587-1597, vol. 128:5.

Saeli et al., "Templated growth of smart nanocomposite thin films: Hybrid aerosol assisted and atmospheric pressure chemical vapour deposition of vanadyl acetylacetonate, auric acid and tetraoctyl ammonium bromide", Polyhedron, 2009, pp. 2233-2239, vol. 28.

Walters et al., "Aerosol assisted chemical vapour deposition of ZnO films on glass with noble metal and p-type dopants; use of dopants to influence preferred orientation", Applied Surface Science, 2009, pp. 6555-6560, vol. 255.

Wang et al., "Spray deposition of Au/TiO2 composite thin films using performed nanoparticles", Nanotechnology in construction 3, Proceedings of the NICOM3, 2009, pp. 395-401.

* cited by examiner

COATING HAVING SOLAR CONTROL PROPERTIES FOR A SUBSTRATE, AND METHOD AND SYSTEM FOR DEPOSITING SAID COATING ON THE SUBSTRATE

CROSS-REFERENCE TO RELATED APPLICATION

This application is a divisional of U.S. patent application Ser. No. 14/435,252, filed Apr. 13, 2015, which is a national stage application of International Patent Application No. PCT/MX2013/000127, filed Oct. 11, 2013, which claims benefit of Mexican Patent Application No. MX/a/2012/011948, filed Oct. 12, 2012, each of which are incorporated herein by reference in their entirety.

FIELD OF THE INVENTION

The present invention relates to coatings with solar control properties deposited on glass intended for architectonic or automotive use, either monolithic or laminated; and to a method and system for depositing said coatings by the aerosol-assisted chemical vapor deposition technique (AACVD).

BACKGROUND OF THE INVENTION

Glass used in buildings and vehicles, generally protects us from the environment (rain, wind, noise, etc.), allowing more pleasant conditions inside. However, ordinary glass does not protect us from solar radiation, since it only absorbs some of the UV radiation, reflecting a total of about 7% and transmits most of the entire solar spectrum. In particular, in the case of automobiles, the trend is to use larger area and more inclined (relative to the horizontal) (front) windshields, thus substantially increasing the amount of incoming solar radiation, reaching about 35% of total heat entering the vehicle, which corresponds to ~50% of heat input only through the windshield. This requires improvements in the properties of glass (by coating) to reduce infrared input improving passenger comfort, increasing the service life of the vehicle interior furnishings (console, carpets, etc.) and reducing the use of air conditioning thereby saving fuel; this is what is known as solar control.

Value added to glass or other products may be increased depending on the functional properties conferred to its surface or some coating deposited on it. Many phenomena that give functional characteristics to a material occur on the surface or in a region close to it. It is therefore possible to coat economical substrates (glass) with functional materials in the form of thin layers. Thus, the resulting product has the functional property of the coating and the characteristics of the substrate, particularly those of glass.

Solar control refers to the ability to change the amount of transmitted or reflected radiation, in the near-UV (UV; 300-380 nm), visible (VIS; 380-780 nm) and infrared (IR; 780-2500 nm) spectral ranges. Low transmittance is generally pursued in UV and IR ranges, while the VIS transmittance may be high (>70%) or low, depending on the application.

In addition to blocking infrared radiation, glass and its coatings must have other properties, such as: high transmittance in the visible spectrum (>70%), high mechanical strength, chemical resistance and weather resistance, they must be able to undergo thermal treatments (tempering, bending), must show a neutral color without iridescence, low dispersion (haze) and be low cost. The aggregate of necessary properties makes the development of this type of coatings a technically complex and very difficult problem.

There are many alternatives to obtain solar control properties. This is reflected in the myriad of scientific papers, patents and patent applications existing on the subject. For example, one scientific publication referring to coatings with solar control properties, is the paper "Solar heat reflective glass by sol-gel nanostructured multilayer coatings" by Z. Nagamedianova and colleagues, published in the journal Optical Materials in 2011, Volume No. 33, pages 1999-2005 describing commercial clear glass coated by the sol-gel method with three layers of oxides, $TiO_2$—$SiO_2$—$TiO_2$, which have the property of reflecting the IRC (near-IR). Transmittance in the VIS>70%, high UV blocking (Tuv<35%) and high reflectivity (>60%) in the 800 to 950 nm range are reported.

Regarding patents, U.S. Pat. No. 5,242,560 "Heat treatable sputter-coated glass" by Guardian Industries Corp. describes a coated glass that may be heat treated by sputtering, consisting of a layer of Ni alloy with one or two layers of Sn oxide, and optionally an intermediate Al layer.

The published US Patent Application No. 2011/0236715 A1 relates to a "Solar control coating with discontinuous metal coating layer" owned by PPG Industries Ohio, Inc. Said application proposes a coating deposited on at least a portion of a substrate, comprising multiple dielectric layers alternating with multiple metal layers, with at least one of the metal layers comprising a discontinuous metal layer.

In British Patent (1971) No. 1241889 "Heat reflecting glass and method for manufacturing the same" owned by Asahi Glass Co., a glass substrate which reflects heat and transmits visible light, comprised by a composite of a metal oxide layer ($TiO_2$, $Ta_2O_5$, $WO_3$, $ZrO_2$, $Nb_2O_5$, $ThO_2$, $SnO_2$) of higher index than glass, in which microscopic particles of metallic Pd or Au are immersed, is claimed. The proposed method is similar to Sol-gel.

Furthermore, there are several methods of synthesis of coatings including: sol-gel, pulsed laser deposition, vacuum evaporation, electron beam, sputtering, CVD and plasma discharge, which includes the variant called AACVD. Among these preparation techniques, the AACVD method has some advantages such as: its simplicity and low cost of implementation, since it needs no sophisticated equipment, ability to operate at atmospheric pressure and it is scalable to industrial level. This technique allows obtaining coatings with several advantages: a) controllable composition, even when changing the composition of a precursor solution during deposition with the purpose of obtaining materials with a concentration gradient, b) good adhesion, c) uniform and controllable thickness over a wide range, d) ease of production of composite materials or multiple layers e) it can be applied for depositing coatings on flat substrates or on inner or outer pipe surfaces, f) finally the properties of the materials obtained are comparable to those of materials deposited by other more sophisticated techniques such as reactive sputtering, reactive evaporation, PLD, etc. which require expensive high vacuum systems, radio frequency sources, gas control, power laser, etc.

The AACVD method is a physical chemical hybrid process for obtaining coatings. It consists in producing a cloud of micrometric drops, from a solution composed of organometallic precursors or inorganic compounds, dissolved in a particular solvent for each type of compound (water, alcohol, acetone, acetylacetone, etc.). The aerosol can be generated by pneumatic, electrostatic or ultrasonic methods. The aerosol precursor solution must be transported to the deposition area by a carrier gas. In the deposition area is the glass substrate, which is heated to a specific temperature depending on the material to be deposited or the precursors used. In the deposition area, as the cloud approaches the substrate it warms up causing initially solvent evaporation, fusion, evaporation or possible sublimation or thermal decomposition of the precursor compound, its diffusion towards the glass surface; where the process continues with the adsorption of the reactants, the chemical reaction, and its evacuation away from the surface.

Some scientific publications referring to systems for production of thin coatings by the AACVD method are:

The paper "Aerosol-Assisted Chemical Vapor Deposited Thin Films for Space Photovoltaics" by Aloysius F. Hepp et al, published by National Aeronautics and Space Administration NASA/TM-2006-214445 describing different reactor designs at atmospheric pressure and low pressure, analyzing their main parameters determining the deposition of thin semiconductor coatings based on In and Cu sulfides for photovoltaic applications. The area of application of these coatings differs from those proposed in the present invention.

Another report "Synthesis, structural characterization and optical properties of multilayered Yttria-stabilized $ZrO_2$ thin films obtained by aerosol assisted chemical vapour deposition" by P. Arnézaga-Madrid, W. Antúnez-Flores, L Monárrez-Garcia, J. González-Hernández, R. Martínez-Sánchez, M. Miki-Yoshida, published in the journal Thin Solid Films in 2008 with number 516, pages 8282-8288, describes how to obtain multilayer coatings of yttria-stabilized zirconia on borosilicate glass substrates by the AACVD method. The paper discusses the influence of various synthesis conditions such as: concentration of the precursor solution, substrate temperature, carrier gas flow, etc., on the coating growth rate. The multilayer structure obtained due to the iterative process used allows modulating the refractive index, thus modifying the reflection of the coating.

There are also patents which relate to CVD (chemical vapor deposition) systems for production of thin films on flat substrates, for example, U.S. Pat. No. 6,190,457 B1 describes a horizontal CVD system for obtaining a thin film semiconductor compound made up of two or more components on the surface of a flat substrate. The CVD system has a cylindrical reactor and a flat substrate is placed inside the reactor. The reactor has a gas supply section and a section for its disposal. Inside the reactor there are three divisions; in the first two divisions a gas mixture made up by one that includes the precursor compounds and another diluent gas. In the third section only an inert gas is fed which transports the two previous mixtures.

The U.S. Pat. No. 7,011,711 B2 presents a vertical system using the method of chemical vapor deposition for producing a thin film on one or more flat substrates. The system comprises a reactor including a vertical pipe and a reaction chamber located inside the pipe. The flat substrate is placed at the end of the reaction chamber. Gas input and exhaust is carried out vertically. Throughout the length of the pipe, partition arrangements are positioned to direct the path of the reaction gases and to evacuate the gases produced after the reaction. Additionally, heaters are connected to the vertical pipe that can control the temperature difference between the substrate and the reactor walls.

Considering the aforementioned technique, the present invention relates to a coating with solar control properties deposited on glass intended for architectural or automotive use, either monolithic or laminated. The coating consists of several layers of different metal oxide semiconductors ($TiO_2$, $ZnO$, $ZrO_2$, $Al_2O_3$) with different refractive index (n), and a layer of metal nanoparticles (Au, Ag). The layer of metal nanoparticles increases IR blocking. Additionally, the use of n type metal-semiconductor active junctions, above and below the nanoparticle layer, allows the injection of negative charges from the metal to the semiconductor (Schottky junction) protecting it from oxidation and also preventing metal agglomeration, to obtain nanoparticles homogeneously deposited throughout the coating. The coating component layers are superimposed in a predetermined order, such as: glass (VC)/diffusive barrier (BD)/dielectrics 1 (D1)/n-type semiconductor, adhesive-protector (A)/metal nanoparticles (M)/n-type semiconductor, protector (P)/dielectrics 2 (D2)/mechanical strength (R); thicknesses are selected so that the coating confers to glass solar control properties, especially a high near-IR blocking (CRI) and high transmittance in the VIS. The number of coating layers may vary being at least three, composed of two n-type semiconductors, distributed below and above the layer of metal nanoparticles.

The coating was obtained by using the aerosol-assisted chemical vapor deposition technique. This technique uses precursor solutions consisting of a salt containing the element to be deposited, for example titanyl acetylacetonate or aluminum acetylacetonate, along with a suitable solvent such as methanol, ethanol, water or some other solvent for completely dissolving the precursor salt. A pneumatic, ultrasonic or electrostatic type nebulizer converts the precursor solution to a cloud of micrometric drops, which are driven by a carrier gas, usually air, toward the glass surface that is at deposition temperature between 100 and 600° C. The particular temperature required depends on the material to be deposited, in other words, on the precursor used. The process is repeated successively with the different precursors to deposit all the layers of the coating.

OBJECTIVES OF THE INVENTION

It is therefore a first object of the present invention to provide a coating with solar control properties and a method and apparatus for depositing said coating on glass substrates, said coating including several semiconductor layers of different metal oxides ($TiO_2$, $ZnO$, $ZrO_2$, $SnO_2$ or $Al_2O_3$), and at least one layer of metal nanoparticles (Au and/or Ag, Pt, Pd) to confer to the glass substrate solar control properties.

It is a further object of the present invention to provide a coating with solar control properties and a method and apparatus for depositing said coating on glass substrates, using, for depositing said coating, the aerosol-assisted chemical vapor deposition technique (AACVD).

A further object of the present invention is to provide a coating and solar control properties, a method and apparatus for depositing said coating on glass substrates, wherein the coating is composed of active n-type protective semiconductor layers deposited one below and the other one above the layer of metal nanoparticles.

These and other objects and advantages of the coating with solar control properties of the present invention will be obvious to those skilled in the trade, from the following detailed description thereof.

DETAILED DESCRIPTION OF THE INVENTION

The present invention describes coatings with solar control properties deposited on glass for architectural or automotive use, either monolithic or laminated. Solar control refers to the ability to modify the amount of transmitted, reflected and absorbed solar radiation in the solar range comprised between 300 and 2500 nm. Generally low transmittance is pursued in the UV and IRC (near-IR) ranges, while transmittance in the VIS should be high (>70%) for automotive applications or low for architectural applications. The coating is composed of two or more layers of different semiconductor metal oxides (TiO$_2$, ZnO, ZrO$_2$, SnO$_2$ or Al$_2$O$_3$) and one or more layers of metal nanoparticles selected from Gold (Au), Silver (Ag), platinum (Pt) and palladium (Pd), uniform, non-continuous and homogenously distributed over the entire surface of the coated substrate.

Figure 1:
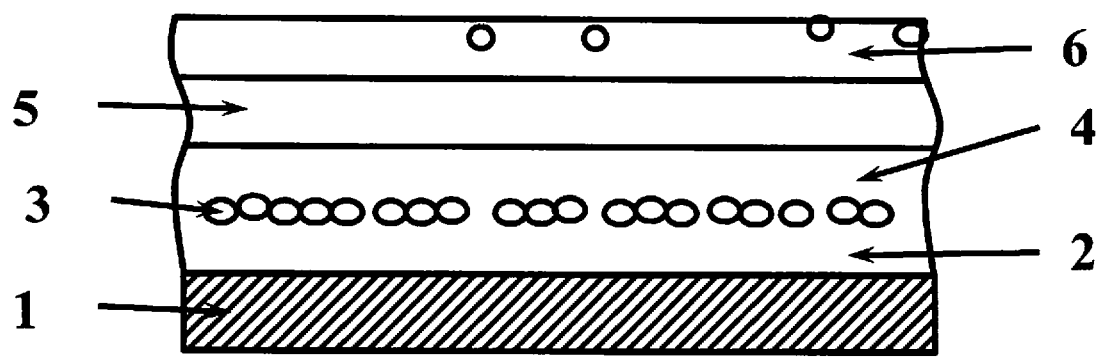
FIG. 1 shows the schematic diagram of a coating with solar control properties, comprising a substrate (1), four layers of metal oxides (2), (4), (5), (6) and a layer composed of evenly distributed metal nanoparticles (3).

As exemplified in FIG. 1, the CS solar control coating of the present invention is deposited on a surface of a glass substrate 1 by the technique of aerosol-assisted chemical vapor deposition technique (AACVD). In the example shown in FIG. 1, the CS solar control coating is deposited on at least one surface of the substrate 1. As described herein, the term "solar control coating" refers to a coating comprising one or more layers or films that affect the solar properties of the coated article, but not limited to the amount of solar radiation, for example, visible, infrared, or ultraviolet radiation. The CS solar control coating can block, absorb or filter selected portions of the solar spectrum, such as IR, UV and/or visible spectrum.

Figure 2:
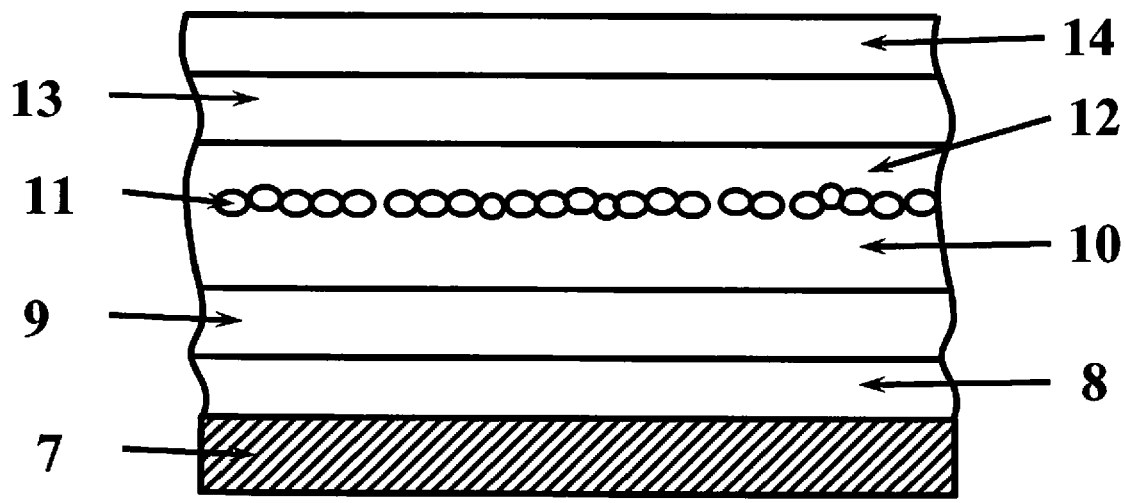
FIG. 2 shows the schematic diagram of a coating with solar control properties, comprising a substrate (7), six layers of metal oxides (8), (9) (10) (12) (13), (14) and a layer composed of uniformly distributed metal nanoparticles (11).

Examples of CS solar control structures are shown in FIGS. 1 and 2, representing 5 and 7 layer coatings, respectively. In the example illustrated in FIG. 1, the CS solar control coating comprises 5 layers: There is substrate (1) on which layer (2), consisting of TiO$_2$ or ZnO, but mainly TiO$_2$, is deposited first. Its thickness shall be between 10 and 70 nm. This first layer also serves as a support for the metal nanoparticles (3) and further as an active protector, given its n-type semiconductor character, to prevent oxidation of the nanoparticles, as well as increase their adhesion. The metal nanoparticles layer (3) is deposited so that the size of the nanoparticles is less than 30 nm, its distribution is uniform and covers a large part of the surface (>80%). The function of the metal layer (3) including Au and/or Ag metals, is to increase IR blocking by absorption and/or reflection (see FIGS. 5 and 6). Subsequently, a second active protective layer (4), consisting of TiO$_2$ or ZnO, but mainly TiO$_2$, whose thickness is similar to the first protective layer, i.e. between 10 and 70 nm, is deposited on it, whose function is to protect the metal nanoparticles from oxidation. Then one or more dielectric layers are superimposed, in order to increase solar control properties, in particular to increase transmittance in the visible range. Therefore, in FIG. 1 layer (5) corresponds to an Al oxide (Al$_2$O$_3$); its thickness shall be between 10-150 nm. The final layer (6) corresponds to a mechanically resistant material, such as ZrO$_2$, SnO$_2$, TiO$_2$ or a compound of them, preferably including the stronger material (ZrO$_2$).

The example illustrated in FIG. 2, schematically shows a CS solar control coating made up by 7 layers. FIG. 2 shows a glass substrate (7) on which the first layer (8) is deposited, corresponding to the diffusion consisting of TiO$_2$ or ZnO with a thickness between 10-70 nm. Subsequently, layer (9) corresponds to one or more dielectrics, e.g. ZrO$_2$ or Al$_2$O$_3$ or both sequentially deposited, its thickness may be between 10-150 nm. Then, the support layer (10) follows, which promotes better adhesion of nanoparticles and also plays the role of active protector, given its n-type semiconductor character, to prevent oxidation of the nanoparticles. Support layer (10) may be composed of TiO$_2$ or ZnO, but mainly TiO$_2$. Its thickness shall be between 10 and 70 nm. The layer of metal nanoparticles (11) is deposited so that the nanoparticle size is 8 to 30 nm, with a uniform non-continuous distribution and covering a large part of the surface (>80%). The function of the metal layer (11) including Au and/or Ag metals, is to increase the IRC blocking, by absorption and/or reflection. This is apparent in FIG. 5, where the spectra are shown as percent of transmittance (% T), reflectance (% R) and absorbency (% A) of a typical solar control coating (structure of example 2) where a vertical arrow indicates the peak position of IRC absorption. Then a second active protective layer (12), consisting of TiO$_2$ or ZnO, but mainly TiO$_2$, whose thickness is similar to that of the first protective layer, i.e. between 10 and 70 nm, is deposited on layer (11). The last dielectric layers are then superimposed, whose function is mainly to increase transmittance in the visible range. Therefore in FIG. 2, layer (13) corresponds to one or more dielectrics, for example Al$_2$O$_3$, whose thickness is similar to that of the first Al$_2$O$_3$ layer, that is, between 10-150 nm and other dielectrics such as TiO$_2$, with thickness between 10-120 nm, may be added on it. The final layer (14) is resistant to abrasion, for example ZrO$_2$, SnO$_2$, TiO$_2$ or a compound of them, preferentially including the stronger material (ZrO$_2$).

These properly deposited structures, with the required thickness, confer to glass solar control properties, particularly IR blocking and adequate transmittance in the VIS. In particular the use of active n-type metal-semiconductor junctions, allows injection of negative charges from the semiconductor to the metal (Schottky junction) protecting it from oxidation and also preventing its agglomeration; this allows obtaining uniform layers of homogeneously distributed metal nanoparticles over a large portion of the solar control coating intermediate surface.

Additionally, it is intended that the developed product has high mechanical, thermal and chemical resistance, sufficient to support the manufacturing processes of tempered and/or laminated glass without making changes that impair the performance of solar control. The coated products were subjected to various tests to determine industrial tempering capability by means of fracture tests, laminating (Pummel tests and boiling under customer standards and ANSI/SAE Z26.1-1996) and chemical contact resistance of samples to acid solutions. Coated glasses successfully passed all of these tests, confirming the feasibility of integrating the developed product to tempering and laminating glass manufacturing processes.

Obtention of Glasses with Solar Control

The aerosol-assisted CVD method (AACVD) is an economical, efficient and useful process for obtaining relatively thin coatings, with maximum thickness of several micrometers. It consists in producing a cloud of micrometric drops, whose diameter is in the range of 1 to 20 mm, from a solution made up by organometallic precursors (acetates, acetylacetonates) or inorganic compounds (halides, nitrates), dissolved in a particular solvent for each type of compound (water, alcohol, acetone, acetylacetone, etc.). The aerosol can be generated by pneumatic, electrostatic or ultrasonic methods. Among the most effective are ultrasonic nebulizers which generate drops with size of a few micrometers and with a closed distribution of sizes (FWHM~10%). In these nebulizers, a drop cloud is produced by vibration (a few MHz) of a piezoelectric crystal, whose ultrasonic waves are concentrated on the surface of the solution, which generates the micrometric drop cloud by means of cavitation. Droplet size depends primarily on the frequency of the piezoelectric (inversely), as well as on surface tension and density of the solution. Drop size and essentially its size distribution decisively influences the conditions (substrate temperature, carrier gas flow) of the tank and the quality of the obtained material. A widespread drop size distribution prevents optimizing synthesis conditions, because a large drop requires different conditions to those of a droplet; resulting in an inhomogeneous and shoddy coating. The precursor solution aerosol must be transported to the storage area by a carrier gas. In the deposition area, is the glass substrate, which is heated to a specific temperature depending on the material to be deposited. The substrate temperature is the key parameter controlling the deposition of material. The optimum temperature of the process depends on the precursors used, consequently on the material to be deposited, but in general it can be said that these are relatively low, between 373 K (100° C.) and 873 K (600° C.). In obtaining a coating, in addition to the thermodynamic conditions it is necessary to verify the kinetics of the process. Since growth of the film depends on: a) the process of transporting the reactant(s) to the vicinity of the substrate surface; where as the cloud approaches the substrate it warms up initially causing solvent evaporation, melting, evaporation or eventually sublimation, or thermal decomposition of the precursor compound, and thereafter its diffusion towards the surface. b) kinetic processes on the substrate surface, where the following processes are required in succession: reactant adsorption, diffusion and convergence on the substrate surface, chemical reaction, diffusion and desorption off the surface of the chemical reaction products and disposal away from the surface, to avoid contamination of the deposited material.

Figure 3:
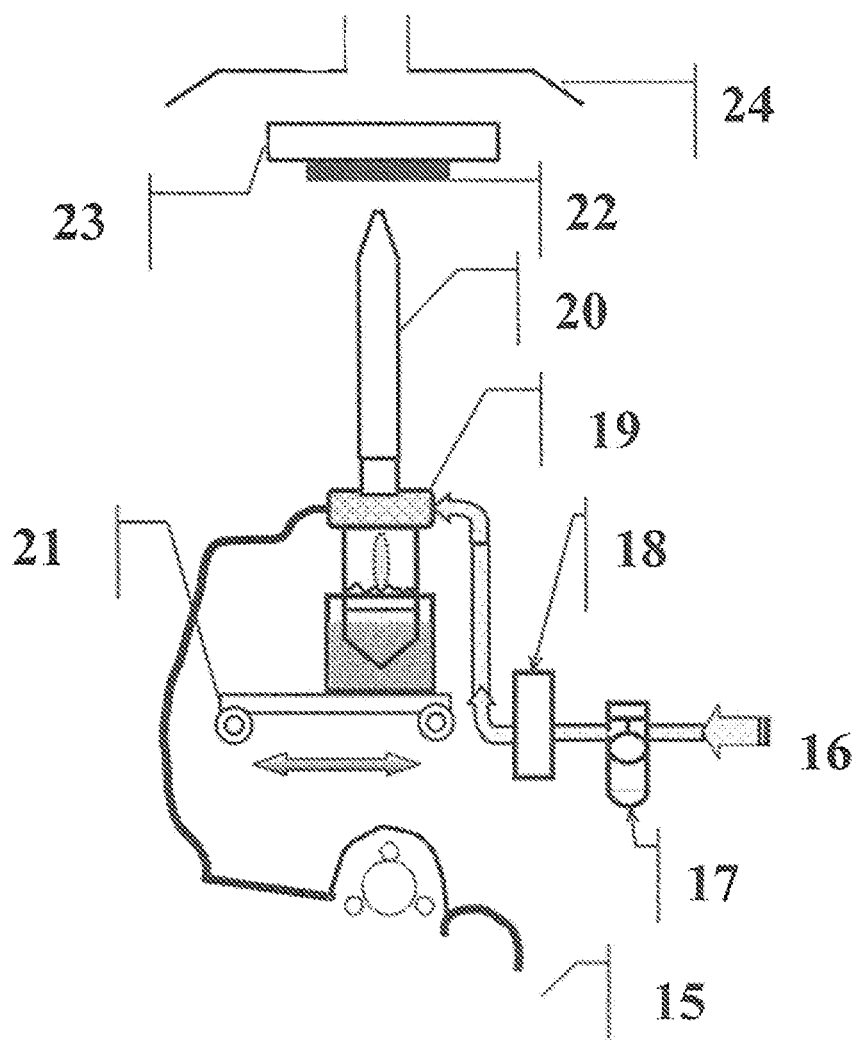
FIG. 3 shows a diagram of the system used for depositing the different layers of solar control coating of the present invention.

Description of the Obtention System:

FIG. 3 shows a schematic diagram of the system used in the process of the present invention. The system consists of the following parts:

a) A heating plate or chamber (23) for elevating the temperature of the glass substrate to the deposition temperature between 100 and 600° C. The heating system comprises a temperature control (not shown in the figure) that allows keeping temperature constant throughout the deposition process. Moreover, heating shall be uniform throughout the glass surface.

b) A nebulizer (19) which may be of pneumatic, electrostatic or ultrasonic type. The carrier gas (16) with its pressure regulator (17) and flow controller (18) and finally the aerosol exit nozzle (20) towards the substrate surface (22).

c) The nozzle drive system of the (21) permits distributing the precursor solution over the entire surface of the substrate in order to obtain uniform coatings. The nozzle (20) is mounted on the nozzle drive system (21) having controlled movement (0.1 to 5 cm) allowing even distribution of the precursor solution over the whole substrate surface, in order to obtain uniform coatings.

d) The gas extraction system (24) to prevent contamination of the deposited coating.

Preparation of the precursor solution.

The precursors are mainly organometallic salts of the elements of interest and as solvent, one suited to each salt was used, preferably aqueous or alcoholic solutions were used due to their advantageous features for aspersion (methanol, ethanol, triple distilled water), concentrations used were from 0.001 to 0.2 mol/dm$^3$. Precursors for introducing dopants were also organometallic salts. Dopant concentration will range from 1% atomic up to the solubility limit of the dopant relative to the base material, which may be up to 10-40% atomic. Complete dissolution of the precursor used by means of suitable stirring, heating and/or ultrasound shall be ensured.

Application Method

The synthesis starts with the preparation of the precursor solution containing an organic or inorganic salt containing the element of interest, for example a chloride, nitrate, acetate or acetylacetonate, tin tetrachloride, zinc nitrate, zinc acetate, aluminum acetylacetonate, zirconium acetylacetonate; and a suitable solvent such as methanol, ethanol, acetone, water or a mixture thereof. The concentration of the solution is in the range of 0.001 to 1.0 mol·dm$^{-3}$.

The substrate (22) is fastened to the heating plate (23). The deposition temperature between 100 and 600° C. is set, and the substrate system is turned on (22) to stabilize substrate temperature. The remaining parts of the AACVD system are configured: nebulizer (19) and nozzle (20). The carrier gas (16) is connected. It is important that the couplings are tight to prevent leakage of aerosol. Additionally the nozzle motion speed (20) is set between 0.1 and 5 cm/min, which allows varying the thickness of the deposited coatings. Nozzle total travel length is also set, depending on the portion of the substrate that is to be covered. The gas extraction system (24) is also turned on to stabilize the temperature in the entire system.

The introduction of carrier gas (which may be air but depending on the coating argon, nitrogen or other similar gas may be used) is also started. For thermal stabilization, the flow is set between 1 and 10 L min$^{-1}$. The particular value of the flow of carrier gas and the deposition temperature depend on the material to be deposited.

Additionally, the precursor solution is introduced in the nebulizer (19). If necessary for long deposition times a larger amount of solution can be added during deposition, using a peristaltic pump (15). A commercial ultrasonic nebulizer (19), operating at 2.4 MHz high frequency was used in tests.

Upon reaching the thermal stability of the whole system, the process proceeds by turning on the nebulizer (19), generating the aerosol cloud of the precursor solution; simultaneously displacement of nozzle (20) via the nozzle drive system (21) is started. The generated cloud enters the nozzle (21). In the nozzle, the precursor solution and carrier gas mixture rises in temperature to between 50 and 150° C.; this preheating to a temperature lower than synthesis temperature ensures that the precursor reach the substrate surface (22) in the reaction zone at the temperature required for thermal decomposition and coating deposition is carried out in optimal conditions. In the substrate surface (22), physical transformations and precursor chemical decomposition are carried out by action of the temperature, yielding a well bonded, high purity coating on its surface. Forming of the thin film on the substrate surface occurs after the thermal decomposition of the precursor, for this reason the surface temperature has a major role in obtaining the material of interest. Additionally, changing the nozzle travel speed allows obtaining thin films of different thicknesses.

Once the chemical reaction takes place and reaction gases are generated, they are evacuated by an extraction system (24), to avoid contamination of the deposited material and thus obtain high purity coatings. The process is repeated with each precursor to deposit all the different layers of the coating.

Examples of Coated Substrates

EXAMPLE 1

Using a 4 mm-thick clear glass (VC), five coating layers were deposited by the AACVD method with the following structure:

| Material | Thickness [nm] |
|---|---|
| $ZrO_2$ | 35 |
| $Al_2O_3$ | 45 |
| $TiO_2$ | |
| Nano-Au | 75 |
| $TiO_2$ | |
| VC | 4 mm |

Optical properties in this coating solar range are summarized in the following table. Transmittances are presented in the ultraviolet (UV 300-380 nm), solar (SOL 300-2500 nm) and visible (VIS 380-780 nm) intervals.

| % T | | |
|---|---|---|
| UV | SOL | VIS |
| 43 | 52 | 62 |

EXAMPLE 2

Using a 4 mm-thick clear glass, seven coating layers were deposited by the AACVD method, with the following structure:

| Material | Thickness |
|---|---|
| $TiO_2$ | 134 |
| $Al_2O_3$ | 106 |
| $TiO_2$ | 97 |
| Nano-Au | |
| $TiO_2$ | |
| $Al_2O_3$ | 101 |
| $TiO_2$ | 68 |
| VC | 4 mm |

The transmittance values at ultraviolet (UV 300-380 nm), solar (SOL 300-2500 nm) and visible
(VIS 380-780 nm) intervals of this coating are:

| % T | | |
|---|---|---|
| UV | SOL | VIS |
| 36 | 42 | 56 |

Figure 5:
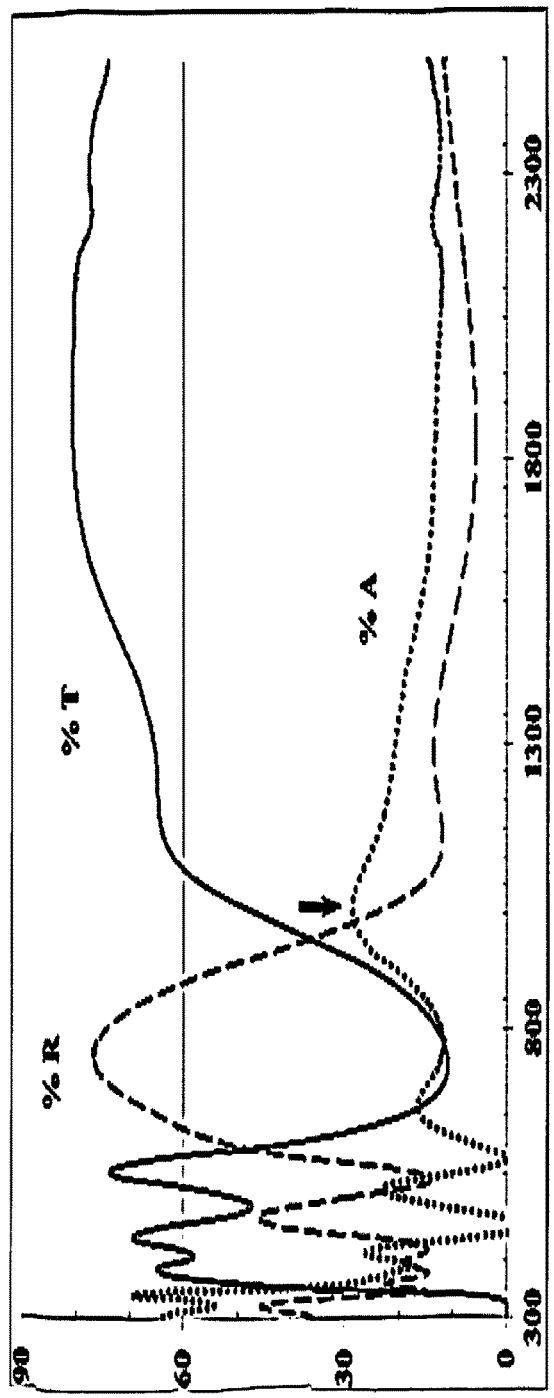
FIG. 5 shows the spectra percentage of transmittance (% T), reflectance (% R) and absorbency (% A) of a typical solar control coating, with the structure shown in Example 2 (VC/TO$_2$/Al$_2$O$_3$/TiO$_2$/Nano-Au/TiO$_2$/Al$_2$O$_3$/TiO$_2$). A vertical arrow indicates the position of the absorption peak in the IRC around 1000 nm.

FIG. 5 shows the spectra in percentage of transmittance (% T), reflectance (% R) and absorbance (% A) of a typical solar control coating, with the structure of Example 2 (VC/$TiO_2$/$Al_2O_3$/$TiO_2$/Nano-Au/$TiO_2$/$Al_2O_3$/$TiO_2$). A vertical arrow indicates the position of the absorption peak in the IRC around 1000 nm.

Figure 4:
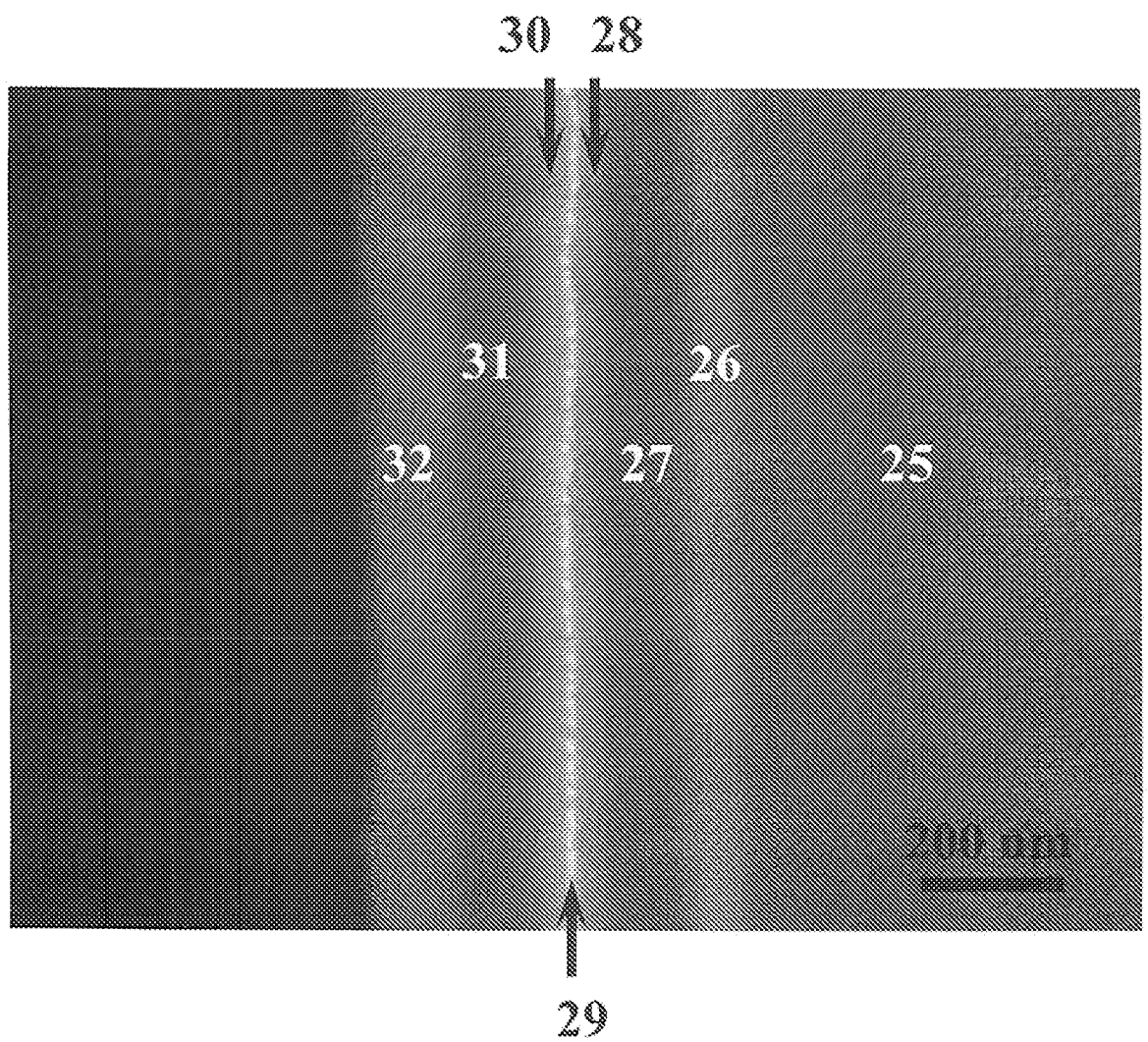
FIG. 4 shows the cross section of a typical solar control coating, where the different component layers can be seen, particularly the uniform layer of metal nanoparticles surrounded above and below by the protective layer of n-type semiconductor.

FIG. 4 shows the cross section of a typical solar control coating, with a similar structure to Example 2, wherein the glass substrate is represented by the number 25; a first layer (26) acting as anti-diffusion barrier (ZnO, $ZrO_2$); a second layer (27) of a first dielectric ($Al_2O_3$, $TiO_2$, $ZrO_2$); a third layer 28 of n-type semiconductor, adhesive-protector (ZnO, $TiO_2$); a fourth layer (29) of metal nanoparticles (Ag, Au, Pt, Pd); a fifth layer (30) of an n-type semiconductor, protector (ZnO, $TiO_2$); a sixth layer (31) of a second dielectric $Al_2O_3$, $TiO_2$ or $ZrO_2$; and seventh layer of materials to improve mechanical strength selected from $SnO_2$ or $ZrO_2$. In said FIG. 4 the different component layers, particularly the uniform layer of metal nanoparticles surrounded above and below by the protective layer of n-type semiconductor, may be seen.

EXAMPLE 3

Using a 4 mm thick clear glass, eight coating layers were deposited by the AACVD coating method under the following structure:

| Material | Thickness |
|---|---|
| SnO2 | 66 |
| $Al_2O_3$ | 249 |
| $TiO_2$ | 86 |
| Nano-Ag | |
| $TiO_2$ | |
| $Al_2O_3$ | 114 |
| $ZrO_2$ | 69 |
| ZnO | 54 |
| VC | 4 mm |

The transmittances at ultraviolet (UV 300-380 nm), solar (SOL 300-2500 nm) and visible (VIS 380-780 nm) intervals of this coating are:

| % T | | |
|---|---|---|
| UV | SOL | VIS |
| 31 | 52 | 63 |

Figure 6:
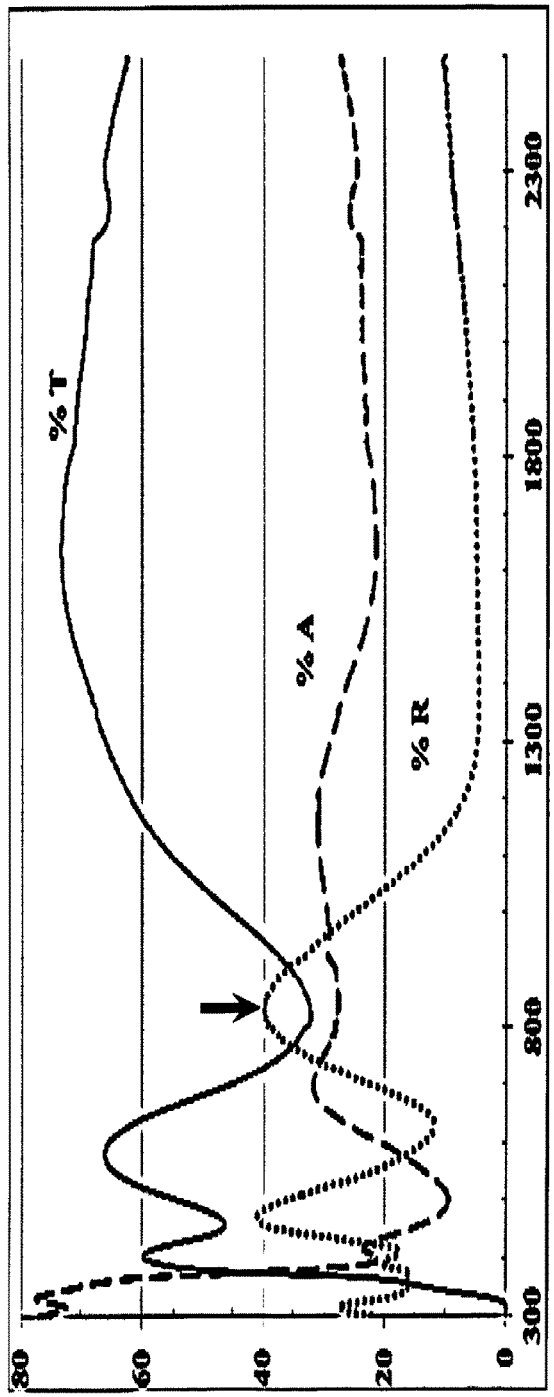
FIG. 6 presents the spectra percentage of transmittance (% T), reflectance (% R) and absorbency (% A) of a typical solar control coating, with the structure shown in Example 3 (VC/ZnO/ZrO$_2$/Al$_2$O$_3$/TiO$_2$/Nano-Ag/TiO$_2$/Al$_2$O$_3$/SnO$_2$). A vertical arrow indicates the position of the reflection peak around 800 run.
Figure 7:
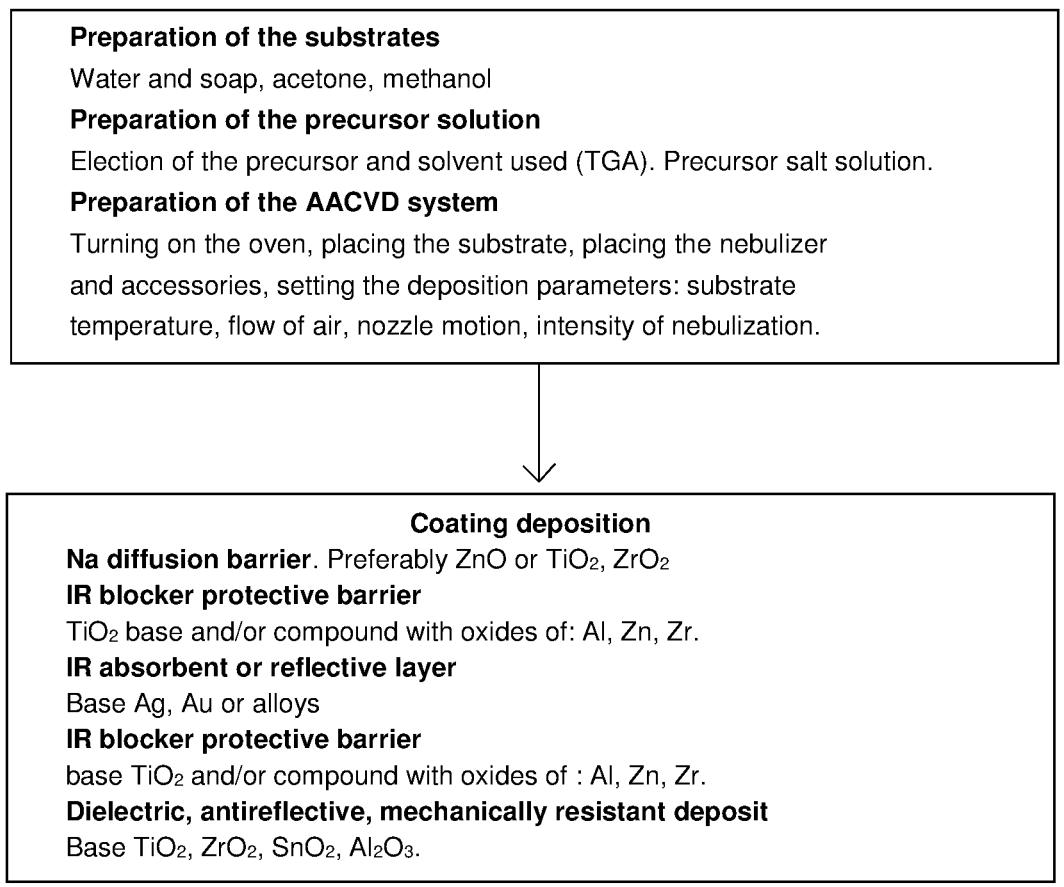
FIG. 7 includes a schematic showing the methodology for the preparation of substrates and coating deposition by means of the AACVD technique.

FIG. 6 presents the spectra in percent transmittance (% T), reflectance (% R) and absorbance (% A) of a typical solar control coating, with the structure of Example 3 (VC/ZnO/ZrO$_2$/Al$_2$O$_3$/TiO$_2$/Nano-Ag/TiO$_2$/Al$_2$O$_3$/SnO$_2$). The vertical arrow indicates the position of the reflection peak around 800 nm.

The invention claimed is:

1. A method for depositing a solar control coating on a substrate comprising the steps of:
   a) placing the substrate in a clamping area;
   b) heating the substrate in a heater chamber to a predetermined temperature;
   c) preparing a mixture of a precursor solution and a solvent;
   d) depositing the mixture of precursor solution and solvent in the heating chamber to form the solar control coating composed of active n-type protective semiconductor layers deposited one below and the other one above a layer of metal nanoparticles having a diameter of less than 30 nm on the recently heated substrate,
   wherein the temperature in the heating chamber produces the evaporation of the solvent and deposits the precursor solution on the substrate surface, forming the solar control coating on the substrate; and
   e) removing the substrate from the clamping area once the coating layer is formed.

2. A method according to claim 1, wherein the step of depositing the mixture of precursor solution and solvent to form at least one coating layer on the substrate comprises: producing a micrometric drop cloud or aerosol of the precursor solution on the substrate.

3. The method according to claim 2, wherein the micrometric drop cloud is applied with a diameter of between 1 to 20 microns.

4. The method according to claim 1, wherein the precursor solution comprises organometallic precursors or inorganic compounds.

5. The method according to claim 4, wherein the inorganic or organometallic precursors are acetates, acetylacetonates, chlorides, nitrates, or halides.

6. The method according to claim 1, wherein the solvent being water, distilled water, methanol, ethanol, acetone, or a mixture thereof.

7. The method according to claim 1, wherein the substrate temperature is between 100° C. and 600° C.

8. The method according to claim 1, wherein the concentration of the precursor solution is from 0.001 to 0.2 mol·dm$^{-3}$.

9. The method according to claim 1, wherein the step of depositing the precursor solution mixture and solvent of step c) comprises: introducing said mixture into the heating chamber by means of a carrier gas with a flow of between 1 and 10 L min$^{-1}$.

10. The method according to claim 9, wherein the carrier gas is air, argon, nitrogen, or a similar gas.

11. The method according to claim 1, wherein the step of depositing the mixture of precursor solution and solvent is performed by the aerosol-assisted chemical vapor deposition technique (AACVD).

12. The method according to claim 1, wherein the solar control coating comprises:
   i) a first active protective layer residing over one surface of the substrate;
   ii) a non-continuous metallic nanoparticle layer residing over said first active protective layer;
   iii) a second active protective layer residing over said metallic nanoparticle layer; and
   iv) a dielectric layer.

13. The method according to claim 12, wherein the non-continuous metallic nanoparticle layer comprises metallic nanoparticles having a diameter of less than 30 nm.

14. The method according to claim 12, wherein the dielectric layer comprises Al$_2$O$_3$.

15. The method according to claim 12, wherein the first active protective layer and second active protective layer comprise a metal oxide, wherein said metal oxide comprises titanium or zinc.

* * * * *